United States Patent [19]
Russell

[11] Patent Number: 4,711,024
[45] Date of Patent: * Dec. 8, 1987

[54] METHOD FOR MAKING TESTABLE ELECTRONIC ASSEMBLIES

[75] Inventor: Robert J. Russell, Boston, Mass.

[73] Assignee: Honeywell Information Systems Inc., Waltham, Mass.

[*] Notice: The portion of the term of this patent subsequent to Dec. 3, 2002 has been disclaimed.

[21] Appl. No.: 800,488

[22] Filed: Nov. 21, 1985

Related U.S. Application Data

[60] Continuation of Ser. No. 564,977, Feb. 3, 1984, abandoned, which is a division of Ser. No. 315,594, Oct. 30, 1981, Pat. No. 4,556,840.

[51] Int. Cl.[4] .............................................. H05K 3/30
[52] U.S. Cl. .................................... 29/832; 324/73 R
[58] Field of Search ........................ 29/574, 593, 825; 324/73 PC, 73 R; 371/15, 25

[56] References Cited

U.S. PATENT DOCUMENTS 3,969,670 7/1976 Wu .
4,556,840 12/1985 Russell .............................. 324/73 R

OTHER PUBLICATIONS

IBM Technical Disclosure Bulletin, vol. 23, No. 9, Feb. 1981, pp. 4078-4079 by Jackson et al.

*Primary Examiner*—Howard N. Goldberg
*Assistant Examiner*—Carl J. Arbes
*Attorney, Agent, or Firm*—George Grayson; John S. Solakian; William A. Linnell

[57] ABSTRACT

A method for achieving printed circuit (PC) board-level testability through electronic component-level design using available technological methods to effect a state of transparency during test, allowing precise verification and diagnosis on a component-by-component basis. Applicable to a greater variety of electronic products than other test methods, and not appreciably constraining functional design, this approach inherently avoids obstacles which prevent other techniques from fulfilling their objectives. This method is applicable to analog or digital electronic components and circuits and results in the ability to largely combine component level and board level test development efforts, a reduction in the need for exhaustive component testing prior to board assembly, the applicability of a single tester configuration to a number of product types, the ability to substitute a verified component for a suspect one without removal, and the ability to detect marginally operative components which have not yet affected board functionality. This method allows the production and stocking of a single set of compatible electronic components to be used in place of existing electronic components as well as allowing existing electronic designs to be converted to this test method by substituting compatible electronic components for all existing electronic components.

1 Claim, 7 Drawing Figures

METHOD FOR MAKING TESTABLE ELECTRONIC ASSEMBLIES

This application is a continuation of application Ser. No. 564,977, filed 2/3/84, now abandoned, which is a division of 315,594, 10/30/81 now U.S. Pat. No. 4,556,840 issued Dec. 3, 1985.

RELATED APPLICATIONS

The following patent applications, which are assigned to the same assignee as the instant application, have related subject matter and are incorporated herein by reference. Certain portions of the system and processes herein disclosed are not our invention, but are the invention of the below-named inventors as defined by the claims in the following patent applications:

| TITLE | INVENTORS | SERIAL NUMBER |
| --- | --- | --- |
| Reciprocal Quiescence Design Method and Apparatus | Robert J. Russell | 316,691 |
| Embedded Memory Testing Method and Apparatus | Robert C. Beauchesne and Robert J. Russell | 316,720 now U.S. Pat. No. 4,481,627 issued Nov. 6, 1984 |
| Compatible Reciprocal Quiescence Design Apparatus and Method | Robert J. Russell | 315,594 now U.S. Pat. No. 4,556,840 issued Dec. 3, 1985 |
| An Electronic Component Testable by a Reciprocal Quiescence Testing Technique | Robert J. Russell | 564,977, now abandoned |

BACKGROUND OF THE INVENTION

1. Field of the Invention

This invention relates to a method of designing and testing electronic assemblies; and more specifically a method of designing electronic components for use in electronic assemblies and a method of testing such components using a component by component testing technique.

2. Description of the Prior Art

Current methods for testing electronic equipment include various methods which individually test each printed circuit board used in the assembled equipment.

Board level automatic test equipment (ATE) intended for general purpose application utilizes either of (or a combination of) two approaches: in-circuit test (ICT) or functional board test (FBT). Both techniques have deeply rooted problems which prevent their conceptual ideals from being fulfilled. In what might be considered tacit agreement with this statement, a serial shift path is included in some designs to reduce the board level test problem to one of more reasonable proportions. However, this technique fails to address certain fault categories and introduces new problems which have yet to be solved.

ICT is an attempt to test individual components of an assembly one-by-one, by providing stimulus directly to the device singled out for test. Instead of using a card-edge connector, an in-circuit test is usually administered by mounting the printed circuit board in a multiple-pin (bed-of-nails) fixture. The fixture pins, which are usually brought into contact with test points (nodes) on the board by vacuum actuation, are configured so as to contact every node on the circuit board. A different test fixture is fabricated for each circuit board type being tested so that the pins line up with the nodes. Test equipment limitations usually dictate reliance upon etch of the assembly being tested to complete the connection on all but the smaller assemblies. While means exist to verify both contact between the board being tested and the individual pins (probes) of the bed-of-nails, and the integrity of board etch, these problems result in decreased throughput and less accuracy of diagnosis.

Providing test stimulus for digital devices requires overdriving the outputs of devices of the assembly that control the target device (i.e., component to be tested) during functional operation of the unit. While the possibility of damaging these other devices, by forcing them to an opposite state, has been empirically shown to be of little current practical significance, this problem will continue to exist, and may even become insurmountable at some point in the evolution of integrated circuits. In many cases, the overdrive capability of the tester is inadequate to deal with particular devices, requiring that the forcing be accomplished at a previous level of logic (i.e., earlier in the circuit paths). Such fixes interfere with diagnostic accuracy, typically being beyond the scope of the tester software (i.e., the program that controls the execution of the ATE tester sequence) to fully, or even largely, integrate. The advent of Advanced Schottky devices, such as the Texas Instruments Incorporated "AS Series", produce an even greater demand on tester hardware and software.

Driver current cannot be increased at the expense of slew rate (i.e., rate of change of voltage), however, since device operation is often dependent on some minimum risetime. More current switching in a shorter time produces increased noise to further complicate tester design goals. The inability to prevent spikes when overdriven circuits attempt to change states, as an indirect result of stimulus to the target device, often requires that other devices be preconditioned to prevent such feedback. Since the algorithms to accomplish this guarding (i.e., precondition to prevent feedback) must deal with device functionality, the tester software must increase in capability at a rate coupled with the change of device complexity. As fewer small scale integrated (SSI) circuits or medium scale integrated (MSI) circuits devices are used, not only will tester software have to be exceedingly complex to identify these feedback loops, but it will often be unable to find a point at which to inject the guarding stimulus.

The drivers to provide the needed stimulus over a variety of integrated circuit logic families are necessarily expensive. Individual driver cost is a major issue where the need for more than a thousand drivers per tester is not uncommon.

ICT stimulus problems notwithstanding, there is no guarantee that the inability of the target device to produce a correct level is caused by an internal fault. Wired-or's, marginal shorts, or loading by other devices are possibilities which require further analysis merely to be discounted. While the problems of developing techniques to deal with these situations do not seem beyond solution, the cure is already far behind the need. Furthermore, the use of devices having connections accessible only on the side of the printed circuit board contacting the bed-of-nails, will likely tax a solution applicable to devices packaged in dual-in-line-packages (DIP's).

In-circuit testing, then, must deal with a variety of problems not fully appreciable when the possible ability to test a single device at a time seems the central issue. The ICT problems may be summarized as follows:

(1) Overdriving requirements.
(2) Possible device damage.
(3) Necessity to guard.
(4) Bed-of-nail contact.
(5) Reliance on etch.
(6) Intra-node diagnosis.
(7) Driver cost.

The functional board test approach is an attempt to provide stimulus and check responses at the external connections of an assembly, usually at the board's edge connections, in much the same fashion as the unit would function in a system environment. To predict the state of external connections, for error detection; and internal points, for fault diagnosis, requires extensive tester software. While the alternative of eliminating this software and learning the responses has been used in some FBT efforts, the disadvantages of doing so outweigh the cost advantage immediately gained in most cases.

If it were true that an assembly, correctly designed from a utilization standpoint, would always respond in the same manner to given stimulus, the only problems to be reckoned with using this approach would involve timing repeatability from one test to another or from one tester to another. However, it is generally incumbent upon the hardware designer only that all such assemblies respond to user stimulus in the same user-visible manner. This requires that a complex board to be tested with an FBT tester be designed for repeatability rather than merely for functionality.

The degree of repeatability necessary depends upon the resolution of the tester. Currently, tester vendors tout nanosecond capabilities, but these figures apply only to hardware control which is not fully integrated into the tester software. This degree of precision, however, would have to be supported by something even more complex than the present stored-pattern concept. Even without such resolution, differences found between a sample board and simulator generated patterns may require manual masking of the response to be checked for at a particular point. Such masking obviously degrades the diagnostic process, adding to the number of cases where a problem may be detected but escapes diagnosis, while often involving repeated lengthy attempts at isolation.

The quality of an FBT program to efficiently resolve faults correctly—as opposed to getting lost or requiring scores of probes on even a small board—is difficult to determine. While it would seem likely that the probing algorithm could be applied as an option in faults simulation, such a feature has not been noted in FBT primary vendor literature, if indeed it exists at all. However, considering that it may take several months to generate FBT patterns with sufficient comprehensiveness of detection, and that solving the diagnostic problem could greatly extend the time, it is not necessarily in the best interest of the tester vendor to provide even more hurdles for the tester programmer. Meanwhile, however, higher levels of integration make mass part changes less acceptable when the test system fails.

Long tester program development times cannot be said to be reduced by automatic test vector generators, as they are characteristically ineffective on complex boards. A simple logic change may produce nearly catastrophic results on a test program even during this long manual development state. The reliance upon product stability means that FBT cannot be depended upon as a predictable fault elimination mechanism throughout a typical product life cycle.

Currently, users are satisfied with comprehensiveness figures measured in terms of "stuck-at" faults (i.e., a fault that causes a point to remain at logic 0 or 1 throughout the test sequence). Exact definitions vary from vendor to vendor. Dynamic faults simulation is desirable, of course, but the tester software problems are probably insurmountable. As it is, one major vendor estimated the time for faults simulation of a 7000 gate equivalent device exercised by 4000 vectors to consume sixteen hours of CPU time. While those involved with memory testing stress pattern sensitivity checks, and while logic becomes more and more dense, the stuck-at evaluations become less and less meaningful.

While a number of hardware additions have been made to offset tester software inadequacies, especially in dealing with analog circuits, it is often found that features cannot be used together. For example, fault diagnosis involving current tracing to determine whether the error is attributable to a defect in the source driver or one of its loads may not be available for use when the tester is applying patterns at fast rates.

Major unresolved problem areas in the FBT approach are:

(1) Repeatability not easily attainable.
(2) Long development time.
(3) Over-reliance on design for testability.
(4) Diagnostic quality indeterminate.
(5) Sensitivity to design changes.
(6) Inability to deal with analog circuitry.
(7) Mutually exclusive features.

An article entitled, "In-Circuit Testing Comes of Age" by Douglas W. Raymond, which compares in-circuit testing (ICT) with functional board testing (FBT) can be found in the August 1981 issue of *Computer Design* on pages 117–124, and is incorporated herein by reference.

As an alternative to the above mentioned ICT and FBT approaches, which are generally applicable to both digital and analog electronic circuits, there exists the notable technique of connecting storage elements of a unit in such a manner as to provide a means of determining the state of each element using a simple algorithm. Using this method which is applicable only to digital circuits, a test system may then be considered to have visibility to each element so connected, with the result of effectively reducing the test problem potentially to one of having to deal only with non-sequential logic (in a system where visibility is provided to all storage elements). Perhaps the most significant implementations of this approach are Non-Functional Test (NFT) and Level Sensitive Scan Design (LSSD), in which storage elements (e.g., flip-flops) are generally connected in a serial shift path in addition to the combinatorial connects which determine the units functionality. This serial shift path is provided for testing purposes by an alternate path being enabled in the test mode and with the value in one storage element being clocked to the next storage element under the control of a test clocking signal.

While implementing the serial string may consume a good deal of the space which would otherwise be available for functional purposes (perhaps one-fifth of the logic), a compelling feature of this approach is that the hardware designer may proceed without having to consider miscellaneous testability issues. Another compelling feature of this approach is the ability to provide a means of system verification in a field setting with a very high degree of stuck-at comprehensiveness.

While being a major step forward in many respects, however, the auxiliary connection of storage elements falls short of being a long-term solution to the test problem. Regardless of the extent to which static problems may be detected, the need for dynamic verification and fault isolation programs must still be addressed. In fact, basic isolation techniques of stuck-at faults are still in the development stage although the design philosophy has been widely known for more than a decade. If both the necessity and feasibility of isolating dynamic faults to the component level by some other means is assumed, the usefulness of this approach in a board level test is greatly diminished. A similar argument would apply to isolating failing boards or subassemblies in the field.

Even statically, this method is cumbersome to implement on addressable memory elements, areas of asynchronous logic, and analog circuits. The latter deficiency obviously limits this test approach to but a segment of the electronics industry.

Perhaps one of the most significant long-term disadvantages to utilizing this approach would be the inability to prevent the duplication of a design that might otherwise be considered proprietary. That is to say, the logic within a custom IC could be deduced by means of the same serial shift path that reduces testability to a combinatorial problem.

Problems with utilizing the serial shift path approach are:
(1) Inapplicability to analog circuits.
(2) Problem with asynchronous elements.
(3) Problem in dealing with addressable memories.
(4) Isolation methods inadequate.
(5) Not applicable to dynamic testing.
(6) Inability to maintain security of design.
(7) Large real estate requirement.

In summary, reliance upon the principal test methods currently available to provide for the future needs of the electronics industry as a whole, seems injudicious. Each method creates new problems while justifying its existence as a solution to problems encountered with other test methods. Rather than allow concentration on the development of more precise exponents of a particular method, these approaches each demand significant ongoing efforts merely to provide patches for their characteristic flaws.

Further, the development of any new testing technique that involves changes to components used in electronic assemblies should be done in a manner that permits the newly designed components to be substituted for existing components with minimum or no changes to existing printed circuit boards or electronic assemblies.

OBJECTS OF THE INVENTION

Accordingly, it is an object of the present invention to provide a method by which existing electronic designs can be converted to a new testing technique by simple substitution of compatible electronic components with minimal or no change to existing printed circuit boards or electronic assemblies.

It is another object of the present invention to provide a method by which a single set of compatible electronic components can be produced and stocked for use in electronic assemblies whether or not the electronic assemblies are to be tested using the new testing technique.

It is another object of the present invention to provide a method and apparatus by which components mounted on electronic assemblies can be tested to nearly the same precision as unmounted components.

It is another object of the present invention to provide a method by which components mounted in electronic assemblies can be tested more thoroughly than unmounted components to the extent that the mounted components are actually in the environment in which they are used and actually driving the loads and inputs of other components to which they are connected.

It is a further object of the present invention to provide a method and apparatus by which components mounted in electronic assemblies can be tested with minimal analysis of how the components are connected or their functions within the electronic assembly.

It is a yet further object of the present invention to provide a method and apparatus by which a known good component can be substituted for a suspect component in an electronic assembly and the electronic assembly tested or utilized without requiring the removal of the suspect component.

It is a still further object of the present invention to provide a method and apparatus by which components mounted on an electronic assembly can be tested with a minimal number of points in contact with the electronic assembly.

It is a still further object of the present invention to provide a low cost and simple method and apparatus by which components can be tested late in the production cycle of an electronic assembly.

It is a still further object of the present invention to provide a method and apparatus by which a board level test can be developed mainly by concatenating a series of component level tests.

It is a yet still further object of the present invention to provide a method and apparatus by which component level tests can be done in the field by service engineers.

This invention is pointed out with particularity in the appended claims. An understanding of the above and further objects and advantage of this invention can be obtained by referring to the following description taken in conjunction with the drawings.

SUMMARY OF THE INVENTION

The foregoing objects are provided by a method for achieving printed circuit (PC) board-level testability through electronic component-level design using available technological methods to effect a state of transparency during test, allowing precise verification and diagnosis on a component-by-component basis by making all components, except the target component to be tested, assume a quiescent state in which all their outputs assume a high-impedance state and in which noise generating internal activity is inhibited. Applicable to a greater variety of electronic products than other test methods, and not appreciably constraining functional design, this approach inherently avoids obstacles which prevent other techniques from fulfilling their objectives. This method is applicable to analog or digital electronic components and circuits and results in the ability to largely combine component level and board level test development efforts, a reduction in the need for exhaustive component testing prior to board assembly, the applicability of a single tester configuration to a number of product types, the ability to substitute a verified component for a suspect one without removal of the suspect component by forcing the suspect component into a quiescent state while placing the verified component in the functional state in parallel electrical contact with the suspect component, and the ability to detect marginally operative components which have not yet affected board functionality. This method allows the production and stocking of a single set of compatible electronic components to be used in place of existing electronic components as well as allowing existing electronic assemblies to be converted to this test method by substituting compatible electronic components for all existing electronic components by providing that the quiescence control selection means be controlled by optionally removable extra input leads or by providing for an integral switch means within the electronic component that is normally in the functional mode but switches to the quiescence mode upon application of an externally supplied switching force that does not require extra electronic input leads on the electronic component.

BRIEF DESCRIPTION OF THE DRAWINGS

The manner in which the method of the present invention is performed and the manner in which the apparatus of the present invention is constructed and its mode of operation can best be understood in light of the following detailed description together with the accompanying drawings in which like reference numbers identify like elements in the several figures and in which.

DESCRIPTION OF THE PREFERRED EMBODIMENT

Figure 1:
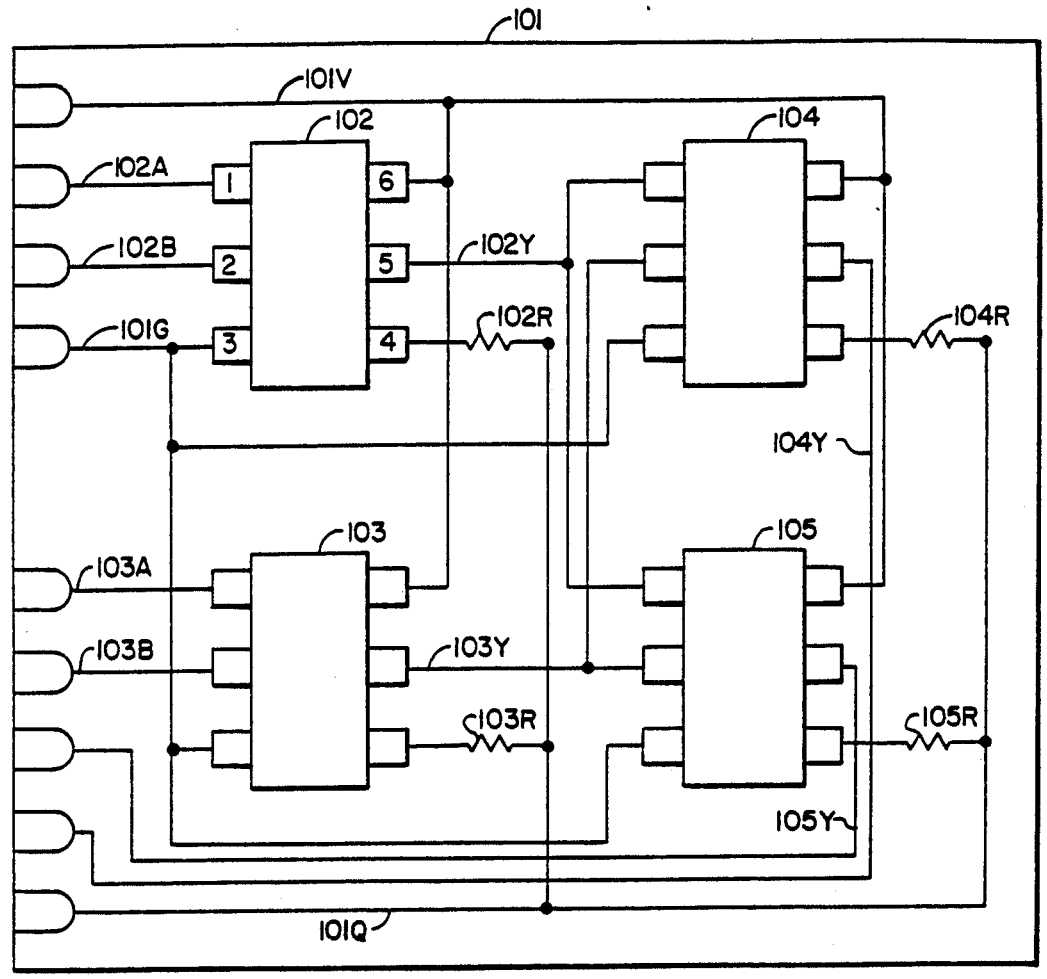
FIG. 1 is a block diagram of an example printed circuit board containing multiple components each of which as designed according to the method of the instant invention.

When an assembly is designed utilizing characteristics of its individual parts verifiable by some means of component test, there is no reason to believe that a failure of the assembly to function as a whole could be caused by anything other than a process error or a component failure which occurred after the part was tested. This argument, which requires that an unpopulated printed circuit board be thought of as a component, allows faults in functional assemblies to be attributed to one of four fault categories:

(1) Design.
(2) Component—inadequate test.
(3) Component—post test failure.
(4) Assembly process introduced.

Faults attributable to poor design—where circuit operation relies on component function beyond specifications—is not an issue requiring consideration in a volume production testability scheme. That is not to say that these faults needn't be detected and cured, but that they will be uncovered primarily by system verification methods and during system usage, and will nearly always be beyond the scope of a chosen test method. FBT is capable of detection some of these faults, but the means of detecting and curing the vast majority will continue to be an activity independent of production testing.

Faults attributable to inadequate component testing will be detected by the same means used to detect design problems. The cure in this case is obviously to update the component test to detect the particular fault mode it missed. The sophisticated technology available for component testing is capable of ensuring that the functionality and parameters the board designer expects of a device are present in the component being tested in all but a small minority of the cases. The overall comprehensiveness of a component test, however, degrades as components move toward the degree of functionality previously found on entire boards. Testability of components is already an issue with some large scale integrated circuits (LSI) and very large scale integrated circuit (VLSI) components. New board test strategies will not solve these problems, but better communication between the board designer and component test engineer will go a long way towards doing so. Ultimately, the refusal to use untestable parts is the real solution, a solution made more practicable as custom devices come into widespread use.

This leaves only two fault categories to be considered in determining the requirements for a volume production testability scheme: component faults which are capable of being detected by a component tester, and process defects.

The chief obstacle to be overcome in attempting to conduct a component-by-component test on the devices mounted on a board is the effect of the other electronic devices mounted on the board. This effect may be eliminated for practical purposes by designing all components (or at least the active ones) such that they may assume a state of quiescence or transparency en masse, yet allowing each to revert to its functional state as it is selected for test. The testability built into a particular component, then, is not used in enabling its own test, but in reciprocation to the quiescence of the other components. This allows the test of the particular device then targeted for test to be conducted without interference from the then quiescent components.

A component designed to have this reciprocal quiescence, in its transparent state, must have two basic qualities other than whatever means is chosen to control its quiescence/functional mode of operation. The first is that all outputs of all (except the target) components must assume a high-impedance condition such as the off (disabled) state of a three-state (tri-state) device. Secondly, the component must not generate appreciable noise either freely or when stimulated by inputs. This may be achieved by adding a control line at appropriate inputs to prevent or limit internal component activity and by turning off any free-running circuits, such as oscillators, etc. The noise referenced includes that which may be induced into power busses. This noise-free quality may not necessitate additional circuitry where it is deemed that a nominal amount of noise from the unmodified component will not interfere with testing to a chosen precision. For example, it is estimated that the placing of the outputs in a high impedance state will be sufficient in the majority of cases, and controlling internal component activity to reduce noise will be required in only a minimum number of the cases where very precise measurements are required.

The requirement for high-impedance outputs eliminates the necessity to overdrive the input signals of the component undergoing test (i.e., the target device) in order to counteract signals originating from the outputs of components not then being tested. This allows the target components input signals to be precisely established by the tester. This high-impedance outputs requirement additionally prevents other components outputs from interferring with the target components outputs when such outputs are connected in a wired-or (bussed) arrangement. Eliminating the overdrive requirement allows the ATE drivers/sensors to be designed for optimizing the precision of parametric measurements (such as output voltage and current, input voltage and current, timing relationships) and functional measurements (such as binary truth table at a specified clock rate) and minimizes the tradeoffs that are otherwise necessary when designing in-circuit ATE drivers/sensors which are able to overdrive non-quiescent signals.

Elimination of the overdriving requirement also allows the tester to establish target component input stimulus at precise times, which is not practical when overdriving with in-circuit testers. In functional board testing, it is difficult, if not impractical or impossible, to provide input stimulus with precise timing if the target component is buried among other components at some distance from the board edge connector because of the within specification timing variations of other components through which the input stimulus must go.

The high-impedance state is high relative to the nominal impedance of the ATE tester driver used to stimulate the target component during functional (e.g., binary truth table) testing. In the case of some parametric testing, the output high impedance must be high relative to the combined impedance of the target component and other components to which it is functionally connected so as to allow measurement on the loading effect of those components without consideration of the loading effect of the driving components output.

The application of the RQD design method can be best understood by reference to several examples. This first quality of requiring all component outputs to assume a high-impedance condition will now be discussed with respect to FIG. 1. FIG. 1 illustrates a printed circuit board 101 having components 102–105 mounted on it. Components 102–105 may be, for example, transistor-transistor logic (TTL) integrated circuits packaged in six pin dual-in-line packages (DIP's) each of which has: two input pins (pins 1 and 2), one output pin (pin 5), a ground pin (pin 4), a supply voltage pin (pin 6) and a quiescence control pin (pin 4). In FIG. 1, the pins are only labeled on component 102 but pins on components 103–105 are referenced by the same pin numbers as the corresponding pins on component 102.

Components 102–105 are such that when a high level signal (a binary 1 in TTL may be considered to be from approximately 2.0–5.0 volts) is applied to quiescence control pin 4, the component operates in its normal mode such that its output stage operates normally producing a high level (binary 1) or low level (level 0) signal on pin 5 as a function of its A and B inputs (pins 1 and 2) and other internal logic. However, when a low level signal (a binary 0 in TTL may be considered to be from approximately 0.0–0.8 volts) is applied to the quiescence control pin 4, the output stage of components 102–105 is disabled and their output pins 5 will be entirely isolated. That is to say, the impedance looking back into the output terminal will be very high, being less than infinite only because of leakage and stray capacitance. This type of output stage is often described as a three-state or tri-state output because the available states are: a binary 0, binary 1 and third state of a nominally isolated or high-impedance state.

In this example, the A and B inputs of components 102 and 103 come directly from a board edge connector on lines 102A, 102B, 103A and 103B, respectively. The A inputs of components 104 and 105 come directly from the output of component 102 on line 102Y and the B inputs of component 104 and 105 come directly from the output of component 103 on line 103Y. The outputs of components 104 and 105, on lines 104Y and 105Y, are brought out to the board edge connector. The quiescence control pin of each component 102–105 is connected to one end of a resistor, resistors 102R–105R, respectively, the other end of which is connected to a common quiescence control line 101Q. Each component 102–105 is connected to ground by line 101G which is brought out to the edge connector. The supply voltage of +5 volts is provided to each component 102–105 on line 101V.

In order to test any component mounted on board 101, all other components are made quiescent and the component being tested is allowed to remain functional. At a minimum, these quiescence requirements necessitate that the output of all quiescent components be placed in a high impedance state so that the outputs of the quiescent components, which may be connected to the component under test, are not actively trying to force the inputs or outputs of the component under test to a particular state. This allows the component under test to be tested in relative isolation without requiring the ATE to overdrive the inputs of the component under test in order to overcome the output signals from other components mounted on the board. This also prevents the outputs of the component under test from being interfered with by the outputs of other components to which they might be connected (e.g., as in bus circuits). For example, in order to test component 105 on board 101 of FIG. 1, the supply voltage of +5 volts would be applied to line 101V, line 101G would be grounded, and components 102-104 would be made quiescent by also grounding line 101Q which in normal operation is connected to a +5 volt supply voltage. The grounding of line 101Q would also make component 105 quiescent, but this is overridden by applying the supply voltage of +5 volts directly to pin 4 of component 105 thus making component 105 active while components 102-104 remain quiescent (as will be seen below in connection with FIG. 3).

From this example it can be seen by establishing a high-impedance state at the outputs of all other functional components, the testing of an individual component can proceed without having to overdrive in providing stimulus to the inputs of the component being tested. In this example, component 105 can be exercised in isolation by applying stimulus at inputs A and B without having to overdrive signals that would otherwise be coming from the outputs of components 102 and 103 on lines 102Y and 103Y, respectively. Thus, by making all other functional components quiescent, no analysis has to be done as to how the component to be tested (i.e., the target component) is connected to other components on the board in developing a basic functional test. This allows the development of a board level test to be done mainly by concatenating a series of component level tests.

Figure 2:
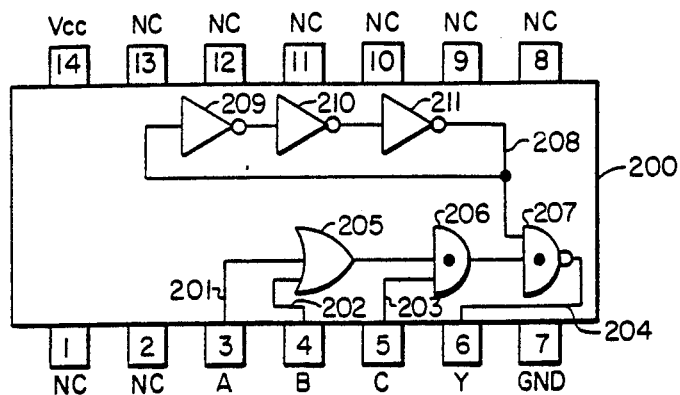
FIG. 2 is an example prior art integrated circuit logic block diagram.
Figure 3:
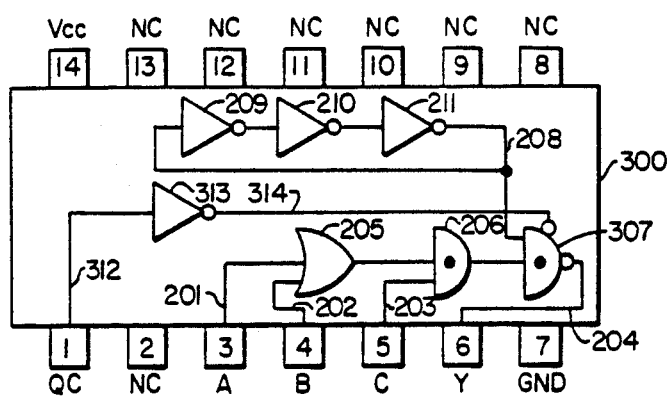
FIG. 3 is an example integrated circuit logic block diagram that is the functional equivalent to the circuit of FIG. 2 that results from the application of the minimum requirements of the instant invention to the circuit of FIG. 2.

The difference between normal components and components designed for testing using the reciprocal quiescence design method can best be understood with reference to FIGS. 2 and 3. FIG. 2 illustrates an example normal component packaged in a 14-pin DIP. FIG. 3 illustrates the logical functional equivalent of the circuit in FIG. 2 after the logical circuit in FIG. 2 has been modifed to meet the minimum requirements of being able to force the outputs to a high-impedance state.

The circuit in FIG. 2 is, for example, a prior art TTL integrated circuit packaged in a 14-pin DIP 200 having pins 1-14. The A, B and C input signals are input from pins 3, 4 and 5 respectively, which are connected to lines 201, 202 and 203 respectively. The Y output signal appears at pin 6 from line 204. The supply voltage, +5 volts for TTL, is applied via pin 14. The internal connections to pin 14 are not shown in the logic diagram of FIG. 2. Pin 7 is connected to ground. The internal connections of pin 7 are not shown in the logic diagram of FIG. 2. Pins 1, 2, and 8-13 are not used an have no internal connections.

Figure 4:
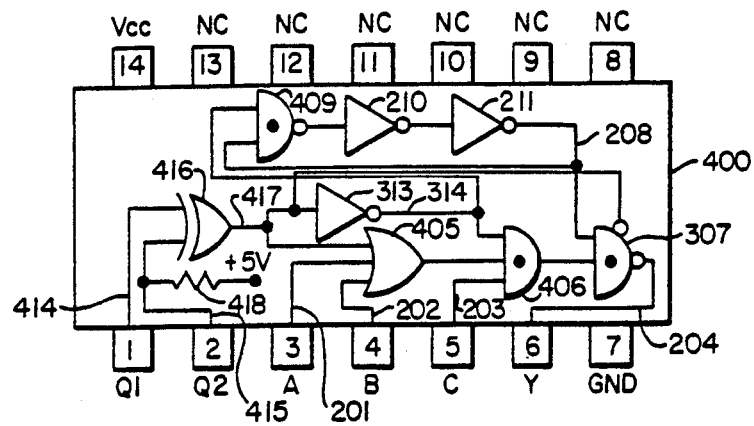
FIG. 4 is an example integrated circuit block diagram that is the functional equivalent to the circuit of FIG. 2 that results from the application of the maximum requirements of the instant invention to the circuit of FIG. 2.

In the example circuit in FIG. 2, OR gate 205 receives the A and B inputs on lines 201 and 202. The output of OR gate 205 provides one input to AND gate 206. The second input to AND gate 206 is the C input from line 203. The output of AND gate 206 is one input to NAND gate 207. The second input to NAND gate 207 comes from the output of inverter 211 on line 208. Inverters 209, 210 and 211 are connected in a loop arrangement to act as a free-running oscillator, the output of which appears on line 208. The output Y from NAND gate 207 appears on line 204. The usefulness and operation of the circuit in FIG. 2 is important only to the extent that it is modified for illustration purposes as shown in FIGS. 3 and 4 below.

FIG. 3 illustrates the circuit of FIG. 2 modified so that a high impedance state can be established at each of its outputs (the Y output at pin 6) under the control of a quiescence control input (QC) at pin 1. Most components of DIP 300 in FIG. 3 are the same as those in DIP 200 in FIG. 2 and operate in same manner and perform the same logic function. The modification consists of adding a quiescence control input (QC) at pin 1 which is connected via line 312 to inverter 313 the output of which is connected to controllable NAND gate 307 via line 314. Controllable NAND gate 307 has been substituted for NAND gate 207 of FIG. 2. The output stage of gate 307 is controllable such that when a high level signal (binary 1) appears on line 314, a high-impedance state is established at the output of NAND gate 307 (i.e., at pin 6). The changes required to be made in TTL circuits in order to produce a controllable high-impedance state at the output are well known in the art and need not be discussed for the purposes of this invention. A reference describing such a controllable output stage is found in the book, *Digital Integrated Electronics* by Herbert Taub and Donald Schilling, published by McGraw-Hill Book Company and copyrighted 1977, which is incorporated herein by reference.

During its normal mode of operation, a high level signal is applied to pin 1 which is then inverted by inverter 313 causing a low level (binary 0) signal to appear on line 314 which in turn permits NAND gate 307 to function normally with a low or high level signal appearing at its output as a function of its two inputs from AND gate 206 and inverter 211.

This high level signal at pin 1 is established at pin 1 during normal board operation by connecting one end of a pull-up resistor (not shown in FIG. 3) to pin 1 and the other end to a common point that is connected to +5 volts. This pull-up resistor, which is mounted on the board, is unique to DIP 300, with other components having their individual pull-up resistors also mounted on the board.

When the board on which DIP 300 is mounted is to be tested and when DIP 300 is not being tested (i.e., when another component is being individually tested), DIP 300 is made quiescent by applying a low level signal at pin 1 which causes a high level signal at the output of inverter 313 on line 314 which in turn forces the output of NAND gate 307 to the high-impedance state. This low level signal at pin 1 is established by connecting the common end (i.e., the end not connected to pin 1) of the external pull-up resistor to ground.

If DIP 300 itself is to be tested, all other functional components are made quiescent and DIP 300 is made active by applying +5 volts to pin 1 which allows NAND gate 307 to function normally, with its output then being determined as a function of inputs A, B and C at pins 3, 4 and 5 and the output of the free-running oscillator 209-211 on line 208.

The second quality of requiring all components to not generate appreciable noise either freely or when stimulated by inputs will now be discussed with respect to FIG. 4. FIG. 4 illustrates the circuit of FIG. 2 as modified in FIG. 3 further modified so that all input stimulated and free-running internal activity which could generate noise can be inhibited under the control of two quiescence control inputs (Q1 and Q2) at pins 1 and 2. Some components of DIP 400 in FIG. 4 and the same as those in FIGS. 2 and 3 and operate in the same manner and perform the same logic function. The modifications in FIG. 4 with respect to FIG. 3 include the addition of a quiescence controlled input signal to all logic gates which receive an input signal directly from outside the component and other necessary changes to inhibit internal free-running activity. These modifications are made in order to inhibit all quiescent component internal activity so as to prevent noise generation including noise generated into the power supply which powers the target component which could effect the measurements of the target components characteristics. Also, inhibiting the internal activity of the quiescent components reduces the amount of noise that may be radiated into the wiring and tester circuitry and thereby allows for more accurate measurement of the target components' characteristics.

The inhibiting of internal activity is done by adding a quiescence control signal to each gate that receives an input signal from outside the component such that the output of the gate can be forced to a steady state independent of the outside input signal. For example, an AND gate which receives an outside input signal is modified to receive a quiescence control binary 0 so that the AND gate's output will be a steady binary 0 regardless of the states of the outside inputs when the component is placed in the quiescent state. Similarly, an OR gate is modified to receive a quiescence controlled binary 1, forcing the OR gate's output to be a binary 1 regardless of the other input signals. An inverter is modified to be a NAND gate having a quiescence controlled binary 0 input forcing the NAND gate's output to be a steady binary 1. A NAND gate is modified to have a quiescence controlled binary 0 input forcing the NAND gate's output to be a binary 1 regardless of the other input signals. A NOR gate is modified to have a quiescence controlled binary 1 inputting forcing the NOR gate's output to be a steady binary 0. A single input buffer having an outside input signal is modified to become an AND gate having a quiescence controlled binary 0 input signal forcing the AND gate's output signal to be a steady binary 0. An exclusive OR gate cannot be modified directly to force its output to a steady state, instead the circuit is modified by going back one logic level toward the inputs and then placing AND, OR, NAND or NOR gates in the paths of the outside input signals so that inputs to the exclusive OR gate can be controlled. The quiescence controlled gating is placed on the input side of the exclusive OR gate so that the output of the exclusive OR gate can be forced to a steady state when the component is in the quiescence mode. The alternative of placing the quiescence controlled gating on the output side of the exclusive OR gate is less desirable because it would allow switching to take place in the exclusive OR gate depending on the state of the outside input signals and this switching could generate noise that might interfere with test measurements.

As can be seen from the above, the modifications to force the output of various gates to a steady state in the quiescence mode is not dependent upon always trying to force the gate outputs to a particular binary state (i.e., the outputs of all gates having an outside input need not be forced to all binary 1's or all binary 0's), but only to a steady state. Therefore, the primary consideration is not whether a component draws, for example, 1 milli-amp or 15 amps as long as it draws it steadily and that stimulating the target component, the outputs of which may be input to the gates within the quiescent components, does not significantly change the power draw of a quiescent component, which might cause noise in measurements of the target component.

Application of the above rules to the circuit of FIG. 3 results in the circuit of FIG. 4. In FIG. 4, OR gate 405, having two outside inputs from lines 201 and 202, has a third input from line 417 which will be a binary 1 when the DIP 400 is in the quiescence mode. This assures that in the quiescence mode, the output of OR gate 405, which replaces OR gate 205 of FIGS. 2 and 3, will be a binary 1 regardless of the state of the inputs from pins 3 and 4. AND gate 406, which has an outside input from line 203, has an added input from line 314 which will be a binary 0 when DIP 400 is in the quiescence mode. This assures that in the quiescence mode, the output of AND gate 406, which replaces AND gate 206 of FIGS. 2 and 3, will be a binary 0 regardless of the state of the outside input from pin 5 on line 203. These modifications assure that effect of the outside inputs is inhibited as early as possible within the circuit.

In addition to inhibiting (i.e., controlled when in the quiescence mode) activity caused by outside inputs, the circuit must also be modified to inhibit free-running activity which may cause noise. In the circuit of FIGS. 2 and 3, the free-running oscillator formed by inverters 209-211 must therefore be inhibitable (i.e., controllable) in the circuit in FIG. 4. In FIG. 4, NAND gate 409, having an input from line 314, which will be a binary 0 in the quiescence mode, replaces inverter 209 of FIGS. 2 and 3. This will force the output of NAND gate 409 to be a steady binary 1 in quiescence mode, which will inhibit NAND gate 409 and inverters 210 and 211 from switching, thus preventing oscillation.

In FIG. 4, the control of quiescence mode selection is different than that found in FIG. 3. In FIG. 3, one pin (pin 1) was used to receive a single quiescence control signal and that pin was connected to an external resistor mounted on the board and quiescence was selected as described above. In FIG. 4, two pins (pins 1 and 2) are used to receive two quiescence control signals on lines 414 and 415 respectively, which control the output of exclusive OR gate 416 on line 417. The quiescence mode of DIP 400 is selected by applying a signal having one binary state to one quiescence control pin and a signal having the opposite binary state to the other quiescence control pin. As long as the input signals to exclusive OR gate 417 are of opposite binary states, its output on line 417 will be a binary 1 and the output of inverter 313 will be a binary 0. These outputs of gates 416 and 313 are used to inhibit the component's activity when the quiescence mode is selected and the binary 1 output of exclusive OR 416 on line 417 is also used to disable the output of NAND gate 307 forcing it to a high-impedance state as was described above for FIG. 3.

One method of using DIP 400 is to connect the Q1 pin (pin 1) to one end of a common pull-up resistor (not shown in FIG. 4) mounted on the board. All other components have their pin 1 (or equivalent) connected to the same point. The other end of the common pull-up resistor is connected to a +5 volt power supply, thus presenting a binary 1 at pin 1 of component 400 and at its corresponding inputs of the other components mounted on the board during normal mode of operation. The second quiescence control pin, pin Q2 (pin 2), is not connected to any point on the board so that during the normal mode of operation a binary 1 will be present on line 415 as the result of one end of internal pull-up resistor 418 being connected to the +5 volt power connections within the component. Thus, during the normal mode of operation a binary 1 is present at both inputs (lines 414 and 415) of exclusive OR gate 416 and DIP 400 is allowed to operate normally. During a test operation, all components are placed in a quiescent state by connecting the end of the common resistor connected to pin 1 to ground which causes a binary 0 to appear on line 414 while a binary 1 remains on line 415. This causes the inputs of exclusive OR gate 416 to be in opposite binary states and selects the quiescence mode of operation for all the components on the board. This grounding of pin 1 can be done by the tester which will cause all components to go into the quiescent state. The tester then also grounds the Q2 pin (pin 2) of the particular target component whose characteristics are to be measured which causes a binary 0 to appear on line 415 resulting in both inputs of exclusive OR gate 416 being in the same binary state. This allows the target component to function normally so that it can be stimulated by the tester and its characteristics measured while the other components remain quiescent.

The necessity for inhibiting component internal activity during the quiescence mode depends upon the amount of noise such activity generates and the precision of the test measurements being performed. FIG. 4 illustrates the one extreme of inhibiting all internal activity and FIG. 3 illustrates the other extreme of allowing all internal activity. In both cases, however, the circuits of FIG. 2 have been modified such that a high-impedance state can be established at each output of the component under the control a quiescence control mode input or inputs. The choice between allowing or inhibiting all internal activity, or allowing some and inhibiting others, depends upon the noise generated, the tester used to make the measurements, and the precision of the required measurements.

Whatever changes are made in the components to permit internal activity control and the establishment of a high-impedance state at the outputs, consideration must be given to minimizing any increase in signal propagation time through the component if propagation time is important. This is particularly the case if the RQD component is to be substituted in an existing electronic assembly design that is sensitive to signal propagation time delays.

FIG. 4 illustrates inhibiting internal activity by basically adding an extra input lead to each gate which has an input originating from outside the component. An analysis of a component may reveal at a logic block diagram level or more central point, which can inhibit multiple inputs, allowing the quiescence control of internal activity. In addition, or alternately, an analysis at a more detailed schematic level may reveal smaller changes or additions that will permit internal activity control and the effecting of a high-impedance state at the outputs.

The quiescence control circuitry, that associated with effecting a high-impedance state at the outputs and that associated with inhibiting internal component activity, need not meet the timing and loading requirements of the normal logic levels associated with the components functional inputs and outputs because the quiescence control inputs need not change at the dynamic rates required of the functional inputs and outputs. In addition, the quiescence control circuitry loads are predetermined in number in that they are associated only with controlling circuitry within the component.

To obtain optimum precision in testing a board built with components having this testability feature requires the shortest practicable path between the tester driver/sensors and a component undergoing test. Therefore, an ATE tester using a bed-of-nails fixture to contact components may be out of place. While a means of moving a board about a test head (or vice versa) is not difficult to implement, the board itself is considered a component by a previous definition, and its etch should therefore be checked.

If one or more points on an etch path have a specified resistance to a common point, such as ground, a single measurement from any one point on that etch path to the common point can verify the integrity of the path both as to its completeness and its isolation (i.e., assuming but a single fault on the path). This type of technique has been utilized by Burroughs Corp. in another testability scheme using overdriving, but need not require a standard resistance for all etch paths as in that method (C. C. Perkins, S. Sangani, H. Stopper, W. Valitski, "Design for In-situ Chip Testing with a Compact Tester", 1980 Test Conference, November 1980, pp. 29–41). Resistance elements could be contained within the integrated circuits in addition to the functional circuitry, or existing terminators could be used, as with emitter coupled logic (ECL). Miscellaneous individual components laid out in a standardized manner can be simultaneously accessed by a single test head.

Because the reciprocal quiescence design (RQD) test method could be described akin to ICT (because the intent of both methods is to test one device at a time), a review of the problems associated with the ICT technique is in order.

Because, when using RQD, all lines to be driven will be in the high-impedance state during testing, there is no overdriving requirement as found in ICT, eliminating the possibility of damaging a good device while applying stimulus. For the same reason, there is no need for digital guarding—all feedback paths are opened. Bed-of-nail contact will continue to be a problem if used in RQD testing. If a movable test head is used, test head contact failures can be pinpointed to a precise geographical location (i.e., component pin by using a technique for the detection of isolated pins) because the failure will occur at a known test head to board relationship. Etch integrity is not required to directly contact a target device, such failures being identifiable as nodal problems. Intranodal diagnosis is simplified because of the relative ease with which the problem may be recreated in a test stand, as discussed below. ATE driver cost can be high where maximum precision is required, but the number of driver/sensors is limited by the maximum single component requirement, rather than dictated by board size.

Many FBT shortcomings are also overcome with the RQD approach. Repeatability of response to valid stimulus is reduced to a component problem, and is therefore assured as long as the user insists on not accepting parts that cannot be said to meet some pertinent specifications. Obviously, parts are selected for inclusion in a design on the basis of some predictable behavior. Related parts which work only in groups which cannot be machine selected, however, have to be treated as a single part. Board test development time is minimal, involving modifications to ATE component test programs only. Design for testability exists on the component level along straightforward and verifiable lines—the quiescence criteria. Diagnosis to a failing node is assured. Component design changes require only component test changes, with other board changes being necessarily simplistic in nature. Analog components pose no special problems, but may merely demand a more complex tester. As with FBT, however, some diagnostic features involving nodal fault tracing may well not work at dynamic rates (such as current tracing).

In comparison with the serial shift path approach of NFT, the RQD technique: is applicable to analog as well as digital circuits, places no synchronism demands on board design, and has no special problems in dealing with memory devices. Isolation to a failing node requires no additional steps, since detection is at that level. There is no limitation to static testing, since stimulus is not applied serially, and the level of complexity need not be simplified to the point where design security is compromised. Additional integrated circuit real estate is a requirement in both RQD and NFT approaches.

Regardless of board test limitations, however, the serial shift path approach is a viable means of providing test visibility within a component. This is not to say that all storage elements need be connected to use the technique at all, but that so coupling some key storage elements can greatly increase overall device testability.

Where reciprocal quiescence is designed into a product using custom IC's all having the same pin configuration, a single test head configuration is sufficient. Discrete components can be arranged for compatibility with this single standard as well, including whatever extra connections a high-precision tester might require (i.e., perhaps six to measure a single resistor). The use of IC's with a variety of pin configurations requires that various simple interfaces be used between the tester and the board being tested. A device allowing automatic selection of these interfaces, arranged about the circumference of a circular fixture mounted at an angle to the board, can easily be constructed. Alignment holes at each component location can be used to help align the test head, but is not a requirement.

The board-level mechanism chosen to cause all components to assume the test or quiescent state, yet allow a single device to revert to its functional mode when accessed by the tester is not critical. Since optimal precision of test requires that the ATE test head contact IC's one at a time, by movement of either the board or the test head, use of a bed-of-nails fixture will not be discussed, although it can be used to advantage in some applications.

Limiting consideration to newly-designed products and components, one or two pins or each component can be devoted to allowing quiescence mode selection. In the single pin method, all such pins are connected through individual resistors to a common point. During functional operation of the board, the common point is connected to the proper voltage level to allow normal component functionality. This point is also wired to be conveniently connected to by the tester when power connections are made. The tester then forces this common point to whatever level is required for selecting component quiescence mode operation. The tester, through test head connections, overrides the level at an individual component to be tested without affecting the others. This single pin method is illustrated by using components designed according to the principle illustrated in FIG. 3 in the board of FIG. 1, which has individual resistors 102R–105R (which can be, for example, 20 ohm resistors for TTL components) connected to common point 101Q.

In the dual pin method, one pin from each device is connected to a common point which is pulled up by a single resistor on the board to a predetermined level. The other pin is intenally pulled to the same level, but is not connected to other points on the board. Gating within the IC forces the quiescence mode whenever the levels of the two pins differ. As the test head contacts each component, the tester may then force both pins to whatever level is chosen as opposite of the norm. Thus, the component accessed by the tester will have both pins at the same level, and be in a functional state, while all other components will have the commonly connected pin at one level and the internally pulled up pin at the opposite level, and be in the quiescent state.

This two pin method is illustrated in FIG. 4 in which pin 1 of all components would be connected to the common pull-up resistor, the other end of which would be connected to +5 volts. Thus, during the functional mode, both inputs (pins 1 and 2) to exclusive OR gate 416 would be a binary 1 and during quiescence mode line 414 would be a binary 0 (0 volts as forced to ground by the test head) and line 415 would be a binary 1 for all components not accessed by the test head. During testing, the target component will be made functional by the test head grounding of pin 2 which will again place both inputs to exclusive OR gate 416 in the same binary state, only this time they will both be a binary 0, and the target component will again function normally while all other components on the board remain quiescent.

Figure 5:
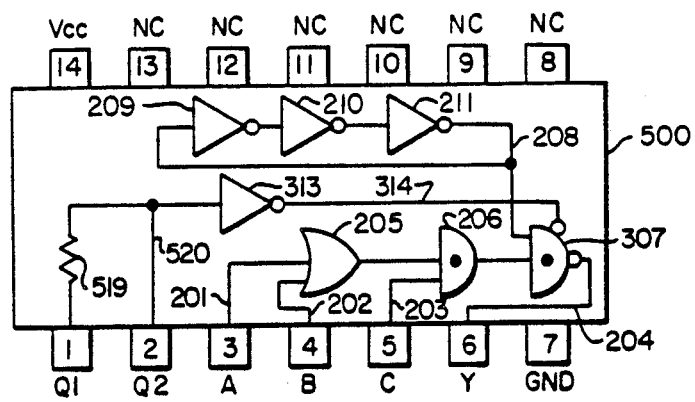
FIG. 5 is an example integrated circuit block diagram that results from changing the circuit of FIG. 3 from a one pin mode selection method of the present invention to a two pin mode selection method of the present invention.

FIG. 5 illustrates the changes necessary to component 300 of FIG. 3 to adapt it from the one pin method to the two pin method. In FIG. 5, the individual pull-up resistor connected externally to pin 1 of FIG. 3 has been placed within the component as resistor 519. When component 500 is mounted on a printed circuit board and pin 1 (Q1) is connected to a common point connected to +5 volts (binary 1), the board is in the funcational mode thus enabling the output of NAND gate 307. When this common point at pin 1 is connected to ground (binary 0) the board is in the quiescence mode, thus establishing the high-impedance state at the output stage of NAND gate 307. Pin 2 is not connected to the board and is used only in testing the component. During testing when the board is in the quiescent mode (pin 1 connected to ground), a binary 1 (+5 volts) is applied to pin 2 (Q2) of the target component by the test head thus enabling the output of NAND gate 307. The principal tradeoff, then, is two extra pins on each component device versus one extra pin on each component device and one extra resistor for each component device on the board external to the components.

Applying the RQD technique to a current family of components is possible without affecting compatibility with previously built parts. For example, in the case of a DIP the one or two extra pins for quiescence mode selection could protrude from the ends of the device, without necessitating a variation in package size. Users not desiring the RQD testing capability could remove the extra pins at convenience breakpoints thus allowing the production and stocking of one component type for use in both non-RQD and RQD tested subassemblies.

Figure 6:
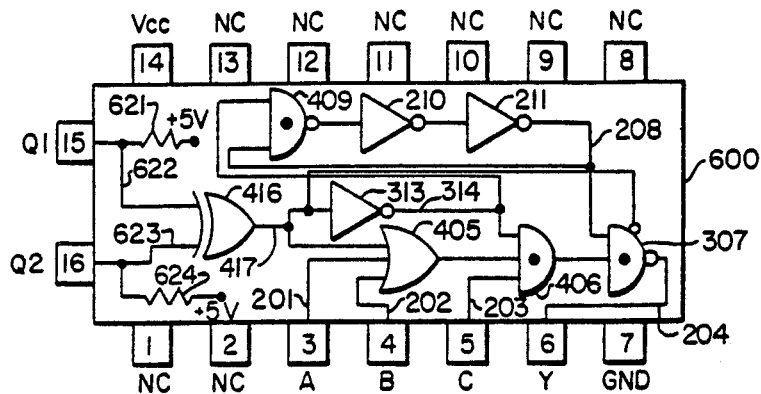
FIG. 6 is an example integrated circuit block diagram that results from changing the circuit of FIG. 4 to the optional quiescence selection pin configuration of the present invention thereby allowing the circuit of FIG. 6, after the removal of pins 15 and 16, to be used in place of the circuit of FIG. 2.

FIG. 6 illustrates this optional RQD approach using the two-pin quiescence mode selection technique illustrated in FIG. 4. In FIG. 6, pins 1 and 2 are not connected to any internal circuits and their function, as illustrated in FIG. 4, has been shifted to the addition pins 15 and 16 of FIG. 6. Pins 15 and 16 in FIG. 6 are placed at the ends of the DIP and constructed such that, if the quiescence mode is not desired, they can be broken off the DIP thus making DIP 600, with pins 15 and 16 removed, a direct replacement having compatable pin use, dimensions and functionality to DIP 200 of FIG. 2. In FIG. 6, pin 15, pin 16, line 622, line 623, resistor 624 have and function the same as the corresponding pin 1, pin 2, line 414, line 415, and resistor 418, respectively of FIG. 4.

The one new element found in FIG. 6 that does not have a corresponding element in FIG. 4 is resistor 621, which ensures that a stable binary 1 signal will be provided if pin 15 is removed. One end of pull-up resistor 621 is connected to line 622 and the other end is connected to +5 volts so that when DIP 600 is used with both pins 15 and 16 removed or simply not connected to the board, DIP 600 will be in the functional mode because a binary 1 will be present on both inputs to exclusive OR 416 on lines 622 and 623. If the quiescence mode of DIP 600 is to be used for component testing, then pins 15 and 16 are left in place and one of these pins (for example, pin 15) is connected to a common pull-up resistor on the board, the other end of which would be connected to +5 volts. The other pin (pin 16 in the example) is not connected to anything on the board. If these connections are made, the operation of DIP 600 is the same as DIP 400 described above except that pins 15 and 16 of DIP 600 and are used in place of pins 1 and 2 of DIP 400.

From the above discussion of FIG. 6, it can be appreciated that either the one pin or two pin functional/quiescence mode selection method can be used with one pin on one end, one pin on both ends or two pins on one end of the DIP. In all cases the objective is to keep the characteristics of the RQD component with the extra pins removed a direct replacement for the non-RQD component so that only the RQD component need be produced or stocked.

Figure 7:
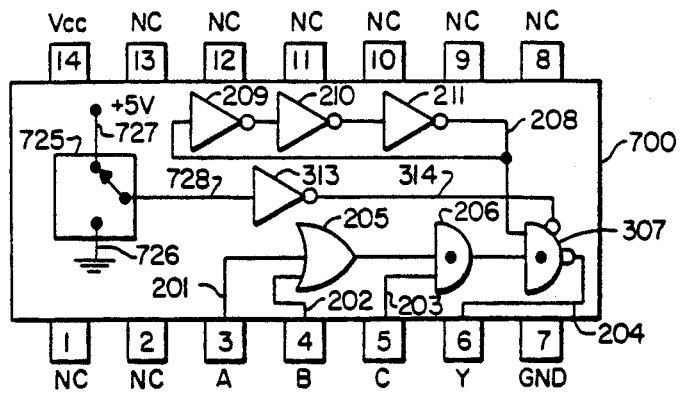
FIG. 7 is an example integrated circuit block diagram that results from changing the circuit of FIG. 4 to have an internal quiescence selection switch which is externally activated by other than the use of signals received at component pins thus allowing the circuit of FIG. 7 to be used in place of the circuit of FIG. 2 without requiring board changes while retaining the ability to select functional or quiescence mode.

Alternatively, non-electrical means could be used in selecting between the functional and quiescence modes. For example, an optical window in each device could be used to allow selection of the quiescence mode when sensing light of a predetermined intensity and wavelength foreign to almost any operating environment. If this photo switch window on the component is accessible by a capped port, breakable by automatic insertion equipment, users not wishing to utilize the feature would not be affected. Using this optical mode selection method, the target component is then shielded from the light and thus reverts to the functional mode allowing it to be individually tested, while the other components remain quiescent. This optical selection method is illustrated in FIG. 7 which is the circuit of FIG. 3 modified to have a photo sensitive switch 725, which selectively gates from a binary 1 (+5 volts) on line 727 to a binary 0 (ground) on line 726 thus placing the component in the quiescence mode by establishing the high-impedance state at the output of NAND gate 307. The output of photo switch 725 on line 728 is connect to inverter 313 and replaces line 312 of FIG. 3 from pin 1 thus eliminating the need for extra pins on the component to allow functional/quiescence mode selection. Photo switch 725, when not stimulated by the selected intensity and wavelength light, connects the binary 1 (+5 volts) applied to input line 727 to output line 728 thus enabling the output of NAND gate 307 and permitting component 700 to function normally. When the board on which component 700 is mounted is to be tested, the entire board is bathed in the proper wavelength and intensity light and photo switch 725 switches states and connects line 728 to line 726 which is connected to a binary 0 (ground) thus establishing the high-impedance state at the output of NAND gate 307. If component 700 is the target component, component 700 is shielded from the switching light source, (for example, by the moving test head), and component 700 reverts to the functional state allowing it to be tested.

As an alternative to using a photo switch to select the functional or quiescence mode of operation, switch 725 in FIG. 7 can be a magnetic switch sensitive to a magnetic field not normally found in the operating environment. If a magnetic switch (such as a reed switch) is used when the board is to be tested, a magnetic field is established that will switch each component's switch 725 so that the output on line 728 is connected to line 726 which is connected to a binary 0 (ground) and thus make the components quiescent. If a magnetic switch is used, the test head would produce an opposing magnetic field over the target component which would switch the target component's switch 725 such that output line 728 was again connected to line 727 which is connected to a binary 1 (+5 volts) and thus enable the output of NAND gate 307 and allow the components characteristics to be tested.

There are other methods of mode selection which are envisioned which involve the replacement of switch 725 with a transducer sensitive to the mode selection stimulus. For example, if switch 725 is replaced by a transducer sensitive to air pressure, the board could be placed in the quiescence mode in a pressurized chamber and the target component could be made functional by the test head applying a vacuum to a port in the target component. The use of other transducers sensitive to radiation (X-ray, gamma, microwave, etc.) or heat is also envisioned in which the board as a whole is bathed in the stimulus and the target component shield by the test head or other means.

In all of these cases the addition of an internal component switch (switch 725 in FIG. 7) allows the functional or quiescence mode to be selected without requiring the addition of pins on a component designed using the RQD method such that an RQD component can be a direct replacement for a non-RQD component without requiring changes, such as the addition of new etch on the printed circuit board, in the electronic assembly that would otherwise be required to provide the proper signals at the additional pins. This allows existing assemblies to be converted to RQD testable assemblies without redesigning them, thus immediately bringing the testing advantages of RQD to the production line. In addition, this internal transducer switch approach allows the stocking of only RQD components such that even if the entire testable subassembly is not converted to RQD, and thus not testable using the RQD method, only one component type need be stocked and it can be used in both RQD and non-RQD assemblies.

Although the above discussion has been with respect to digital integrated circuits mounted in DIP's, these same principles apply to analog or discrete, active or passive, components. A discrete component is an individual component such as a transistor, diode, resistor, capacitor, etc. An active component is a component that has qualities other than inductance, resistance or capacitance (e.g., a component exhibiting a non-linear quality such as amplification) whereas a passive component exhibits only the qualities of inductance, resistance or capacitance. Active or passive discrete components that interfere with the test equipment's ability to measure must either be tested as part of a target group which includes all the components to which they are directly connected (e.g., by wiring) so that they can be tested in isolation from components outside the target group, or they must be altered to include an electronic switch to provide the required isolation (i.e., high impedance state at their outputs when in the quiescence mode). The determination of whether a component as connected in the circuit interferes or not with the test measurements is dependent upon both the characteristics of the test equipment being utilized, the types of measurements to be made, and their required precision. For example, an electronic switch, such as a field effect transistor based device, having control input(s) for selecting between the functional and quiescence modes would have to be added to one of the leads of a resistor if the resistor value is low and the test equipment could not otherwise overdrive the circuit. Similarly, an electronic switch might have to be added to one of the leads of a capacitor to achieve the required isolation depending upon the testing frequency and the size of the capacitor. For devices having transistor output, the output stage can be modified as described above for digital integrated circuits to allow the establishment of a high-impedance state at the output. These components may also have to be modified to inhibit input stimulated activity or free-running activity that generates noise. Inputs can be inhibited by making the first transistors in the input path into a gate or by the addition of an electronic switch if necessary.

In all cases, the important thing is to be able to establish a high-impedance state at all outputs of the target group and the ability to inhibit noise generating internal activity. For active or passive discrete components that do not interfere with the test equipment's ability to test a target component (or group), the component (or group) need not be altered to allow quiescence (i.e., isolation and noise free) and they can be tested individually or with others as part of a larger target group.

A factory test operation based on this RQD testing approach can utilize a tester of the type described as the key test element. In addition to this automatic tester, a number of stations requiring manual test head placement can be used for verifying automatic test results. While perhaps only one of these stations could duplicate the precision of the key tester, all could share the data base used by the key tester, and be capable of executing the same instruction set. Besides being used for board testing, this key tester can be used as an incoming inspection device, since the ability to precisely check components after board assembly greatly reduces the need for pre-assembly test.

While shorts and in-circuit testers can be used to reduce the load on the key tester, the only other necessary test is for continuity—to prevent possible multiple faults from escaping detection in the process.

Faults reported by the key tester during automatic board test fall onto one of six categories:
(1) Board power short—unit draws excessive current.
(2) Contact failure—inability of the test head to contact a specified point on the board.
(3) Etch open or short—improper resistance signature at a specified point on the board.
(4) Lack of quiescence—a specific point on the board requires excessive drive.
(5) Component failure—functional or parametric failure of a specific component.
(6) Component group failure—a matched set of components did not meet group requirements (e.g., as with "mostly good" memories).

In the first four cases, errors can be verified and diagnosed by low to moderate skill level personnel using only a sensitive meter and (in the fourth case) power supplies. For non-verified errors and for verifying reported individual component failures, the auxiliary stations connected to the key tester are required. The last case requires either further automatic processing or more highly skilled personnel.

There is, of course, no guarantee that a board passed by this test process will work in a system. Aside from those which fail when rechecked on the tester, there are those which have faults either not checked on the tester, or are incapable of tester detection (including design faults). For these boards, troubleshooting in a test stand by highly skilled personnel is usually the only alternative to scrapping.

In dealing with complex components, it is usually the case that verifying the faults to a specific device is as difficult, or even more difficult, than determining a component or group of components to be suspect. Hence, changing suspect components without proper verification is commonplace. This practice is, unfortunately, related to the cost of the component: in general, the more a component costs, the greater the complexity, the more difficult to verify.

With components capable of quiescence, however, it is possible to cause one or more of these components to enter the quiescence mode, while leaving the others in a functional state—the opposite of what takes place during board test. Another component may then take the functional place of a suspect one, merely by bringing it in contact with the pins of the suspect one, save for the quiescence/functional mode selection pin or pins. For example, if the component in FIG. 4 is suspect, it could be made quiescent by grounding pin 2 (Q2) while +5 volts is continued to be applied to pin 1 (Q1). A known good component could then be substituted by connecting all of its pins, except pin 2 (Q2) to those of the suspect component. This would place the known good component in a functional state in parallel with the quiescent suspect component. While this practice is limited to circuits where the small additional loading would not interfere with proper operation, and does not aid in troubleshooting most design problems, it does offer the opportunity for lower skilled personnel to be used in test stand troubleshooting of complex problems.

The factory setting, where comprehensiveness and efficiency are generally more important than equipment cost, is at one end of the spectrum of test requirements. At the other end of the spectrum is the hobbyist, with field and depot requirements falling somewhere in between. The hobbyist having a desire to make repairs without involving professionals, would be primarily concerned with test equipment cost, would be willing to accept low comprehensiveness (by factory standards), and would care little of efficiently.

By proper board design, and using system diagnostics to identify faulty boards, the hobbyist or field service engineer can be supplied with a relatively low cost tester capable of isolating most board problems. The use of the RQD method permits portable testers for hobby or field use because of the required small number of contact points with the electronic assembly in order to test individual components. The contacts need only be made to: supply power to the electronic assembly, select the quiescence mode, stimulate the target component's inputs and measure it's outputs. The large number of contact points and driver/sensors required for in circuit component testers prohibit their hobby or field use. As an alternative to portable self contained RQD testers, a portable RQD tester could communicate with a diagnostic center over telephone lines, enabling remote control of tester functions with the ability to direct manual test head placement and manual measurements. In some cases, such a tester can utilize subassemblies (such as the memory) of the faulty systems to reduce tester costs.

Reciprocal Quiescence Design (RQD) is the basis of a comprehensive approach to automatic board testing over a wide range of test requirements and product types. The RQD circuitry in each component can be considered an electronic socket, offering the opportunity to precisely test individual devices without interference, and make trial replacements of suspect devices. The initial cost of including the additional circuitry is returned in lower overall test costs of complex products, and perhaps even in the replacement of mechanical sockets otherwise included for testability purposes using other methods.

Although the preferred embodiment has been described primarily in terms of TTL integrated circuits in digital systems, the present invention is equally applicable to analog circuits in digital systems or analog systems. Further, the present invention is equally applicable to other families of digital integrated circuits such as current mode logic (CML), metal oxide semiconductors (MOS), complementary metal oxide semiconductors (CMOS), emitter coupled logic (ECL), integrated-injective logic (IIL), and others.

Although the preferred embodiment has been described in terms of using one particular logic level to select the quiescence mode and opposite logic level to select the functional mode of the component, the reverse logic levels can be used. Further, the description has been in terms of circuits packaged in DIP's mounted on printed circuit boards, but it will be appreciated that other circuit packaging techniques, including multiple circuits in one package, and other mounting techniques can be used so long as the target components' inputs can be stimulated, the outputs measured, and quiescence/functional mode selected.

While the invention has been shown and described with reference to the preferred embodiment thereof, it will be understood by those skilled in the art that the above and other changes in form and detail may be made therein without departing from the spirit and scope of the invention.

What is claimed is:

1. A method of making an electronic assembly that can be tested using a reciprocal quiescence testing technique comprising the steps of:
    A. manufacturing a printed circuit board having means for mounting electronic components, and having means for electronically connecting predetermined terminals of said electronic components;
    B. only mounting electronic components on said electronic assembly that have one or more quiescence control inputs which can be optionally removed wherein if said optional removable quiescence control inputs are removed said electronic component will be in a functional state;
    C. connecting said one or more quiescent control inputs of each of said electronic components to receive one or more quiescent control signals;
    D. providing means for placing each of said electrical components in a functional state during normal operation;
    E. providing means for placing all but one of said electronic components in a quiescent state when using said reciprocal quiescence testing technique; and
    F. providing means for placing said one of said electronic components in said state when using said reciprocal quiescence testing technique; whereby during normal operation all electronic components are in a functional state, but during the testing of said electronic assembly, all said electronic components can be placed in a quiescent state at one time by application of said one or more quiescent control signals to said one or more quiescent control inputs yet allowing each electronic component to be placed in a functional state when that particular electronic component is a target component being tested whereby said target component can be tested in selective isolation from other electronic component connected to said target component's inputs or outputs, and whereby said testing can be conducted with little or no analysis of the interconnection of said electronic components within said electronic assembly.

* * * * *